United States Patent [19]
Shin et al.

[11] Patent Number: 5,717,253
[45] Date of Patent: Feb. 10, 1998

[54] STRUCTURE FOR FORMING AN IMPROVED QUALITY SILICIDATION LAYER

[75] Inventors: Heon-Jong Shin, Seoul; Yunheub Song, Suwon, both of Rep. of Korea

[73] Assignee: Samsung Electronics Co., Ltd., Suwon, Rep. of Korea

[21] Appl. No.: 736,490

[22] Filed: Oct. 24, 1996

Related U.S. Application Data

[63] Continuation of Ser. No. 427,999, Apr. 25, 1995, abandoned, which is a continuation of Ser. No. 110,830, Aug. 24, 1993, abandoned.

[30] Foreign Application Priority Data

Aug. 24, 1995 [KR] Rep. of Korea ......... 92-15206

[51] Int. Cl.$^6$ ............. H01L 23/48; H01L 23/52
[52] U.S. Cl. ........ 257/754; 257/751; 257/757; 257/768; 257/770; 437/192; 437/193; 437/200
[58] Field of Search ................... 257/754, 757, 257/768, 751, 767, 770; 437/192, 193, 200

[56] References Cited

U.S. PATENT DOCUMENTS

| | | |
|---|---|---|
| 4,886,764 | 12/1989 | Miller et al. ............. 257/757 |
| 4,916,397 | 4/1990 | Masuda et al. ............. 257/754 |
| 5,075,761 | 12/1991 | Liou et al. ............. 257/754 |
| 5,166,771 | 11/1992 | Godinho et al. ............. 257/754 |
| 5,194,929 | 3/1993 | Ohshima et al. ............. 257/754 |
| 5,237,192 | 8/1993 | Shimura ............. 257/757 |
| 5,241,207 | 8/1993 | Toyoshima et al. ............. 257/754 |
| 5,243,220 | 9/1993 | Shibaza et al. ............. 257/754 |
| 5,313,084 | 5/1994 | Wei ............. 257/757 |
| 5,346,860 | 9/1994 | Wei ............. 437/200 |

*Primary Examiner*—Tom Thomas
*Assistant Examiner*—David Ostrowski
*Attorney, Agent, or Firm*—Cushman Darby & Cushman, IP Group of Pillsbury Madison & Sutro LLP

[57] ABSTRACT

A semiconductor device having a silicide layer with substantially even thickness, and a method for making a silicide layer having substantially even thickness in a semiconductor device are disclosed.

A prefereably doped polycrystalline silicon layer is formed as a first conductive layer on an insulating underneath layer. After that, an undoped polycrystalline silicon is deposited on the first conductive layer as a buffer layer for preventing silicon diffusion. A second conductive layer is formed thereon. Subsequently, a refractory metal layer is formed on the second conductive layer, and a heating treatment is carried out to form a silicide layer on the first conductive layer from the materials of the buffer layer, second conductive layer and refractory metal layer.

18 Claims, 3 Drawing Sheets

STRUCTURE FOR FORMING AN IMPROVED QUALITY SILICIDATION LAYER

This is a continuation of application Ser. No. 08/427,999, filed on Apr. 25, 1995 now abandoned, which was abandoned upon the filing hereof and which is a continuation of Ser. No. 08/110,830 filed Aug. 24, 1993 (abandoned).

BACKGROUND OF THE INVENTION

1. Field of the Invention

The present invention relates to a semiconductor device having a silicide layer and a method for making such a semiconductor device. More particularly, it relates to an improvement of a silicide layer formed of silicon and metal.

2. Description of Related Art

Word lines of a memory device or gate electrodes of a metal oxide semiconductor (MOS) device are generally inter-connected with metal lines. It is preferable to have low sheet resistance in these metal lines. In the case of designs below 1 μm, the enhancement in performance speed by high integration diminishes and there are problems with an increase of the resistance R of the metallization layer due to the microscopic structure of semiconductor devices. Another problem is propagation delay due to the capacitance C increased by reduced metal pitch. Such problems have been by ameliorated by silicidation. A metal silicide layer with a low melting point and characteristics similar to and resistance lower than polycrystalline silicon is used as a low-resistance gate material instead of relatively high-resistance polycrystalline silicon.

FIGS. 3A to 3D depict a conventional silicidation process. This conventional technique, may for example be applied to the formation of gate electrodes of MOS transistors.

First, an insulating oxide layer 2 is formed on a silicon substrate 1, as shown in FIG. 3A. A polycrystalline silicon layer 3 is then formed on the insulating oxide layer 2, as shown in FIG. 3B. Since the polycrystalline silicon layer 3 has high resistance, a high density impurity (e.g., at about 1E16 ions/cm$^2$) is implanted on the polycrystalline silicon layer 3. Subsequently, after a metal layer 4 having high melting point is formed on the polycrystalline silicon layer 3, as shown in FIG. 3C, a silicidation process is carried out by a heating treatment such as two-step annealing or lamp annealing.

A silicide layer 5 is thereby formed, as seen in FIG. 3D. Silicidation can be performed by a heating treatment where metal and silicon contact each other, as mentioned above. For example, if the metal in metal layer 4 is titanium or tantalum, TiSi$_2$ or TaSi$_2$ may be formed as the silicide layer, respectively.

However, since the silicide film is formed on the heavily-doped polycrystalline silicon layer 3, an uneven natural oxide film (not shown) forms on the polycrystalline silicon layer 3 due to the difference of density. This uneven natural oxide film can cause the silicide layer 5 to be uneven as well, as seen in FIG. 3D.

In addition, the uneven silicide layer can lead to agglomeration or discontinuities in the silicide layer where a portion of the underlying polycrystalline silicon may extend upwards through the silicide layer to form an "island" on the surface of the silicide layer. This can occur in a subsequent sequential heating treatment.

SUMMARY OF THE INVENTION

It is an object of this invention to provide a semiconductor device having a silicide layer and a method for making such a semiconductor device that can prevent agglomeration of the silicide layer and yields a silicide layer having a substantially even thickness.

The present invention uses an undoped polycrystalline silicon or an undoped amorphous silicon instead of heavily doped polycrystalline silicon which is a cause of uneven silicidation. Frequently, polycrystalline silicon moves or diffuses into the silicide layer to produce agglomeration by epitaxial growth. Accordingly, by forming a buffer layer between a lower, doped polycrystalline silicon and an undoped polycrystalline silicon layer or undoped amorphous silicon layer formed thereon, mutual silicon or movement diffusion is prevented. A silicide layer of even thickness is thereby achieved. In addition, agglomeration can be prevented, too.

The buffer layer is influenced by the refractory metal layer in the process of silicidation, and then removed.

DESCRIPTION OF THE PREFERRED EMBODIMENTS

A first preferred embodiment of the present invention is now described with reference to FIGS. 1A to 1D.

The present invention primarily relates to a silicidation process, and the first embodiment of FIGS. 1A to 1D may, for example, be applied to the formation of gate electrodes of MOS transistors and its series of processes may be applied to the formation of conductive lines of a memory device.

Figure 1A:
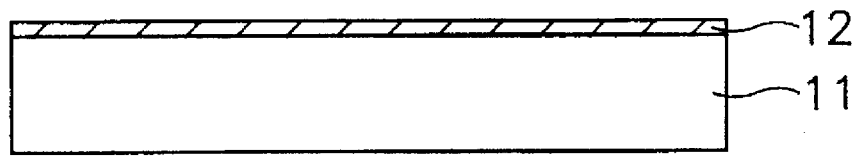
FIGS. 1A to 1D illustrate steps in the formation of a silicide film in accordance with a first preferred embodiment of the present invention.

First, an insulating layer 12 (hereinafter, an "underneath layer") such as a thermally grown oxide is formed on a semiconductor substrate 11 to a thickness of about 100–200 Å, as shown in FIG. 1A. Depending on a particular silicidation application, such as in a bit line, additional layers may also be formed.

Figure 1B:
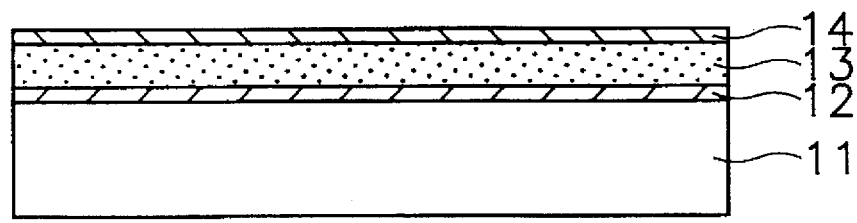

A first conductive layer 13 is then formed on the underneath layer 12 to a thickness of about 1000–1500 Å, as shown in FIG. 1B. A buffer layer 14 is then formed thereon. A polycrystalline silicon layer can be formed as the first conductive layer 13, and an oxide layer or a TiN layer can be formed as a buffer layer 14.

The thickness of the buffer layer 14 is about 10 to 100 Å. Ion implantation or phosphorus-oxychloride (POCL) deposition of first conductive layer 13 may be carried out so that the polycrystalline silicon layer 13 contains an impurity, prior to the formation of the buffer layer 14. Nitride molecules or nitride ions may be implanted to the first conductive layer 13.

Figure 1C:
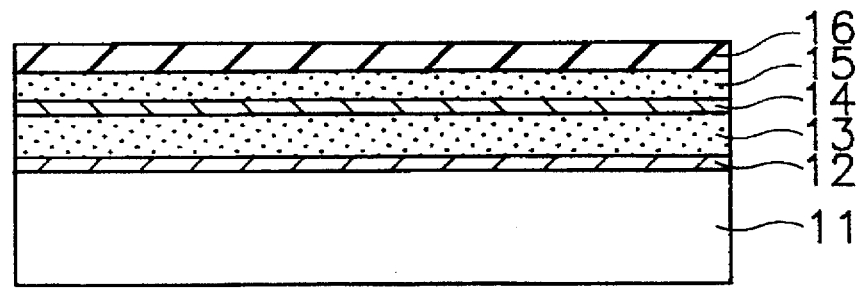
Figure 1D:
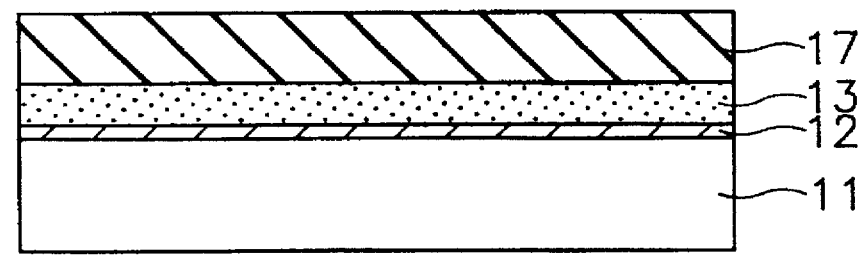

Subsequently, a second conductive layer 15 made of polycrystalline silicon or amorphous silicon is formed to a thickness of about 500–1000 Å on the buffer layer 14, as shown in FIG. 1C. Second conductive layer 15 is preferably not doped. A refractory metal layer 16 is then formed on the second conductive layer 15 to complete the structure prior to the silicidation process. Titanium is used for the metal layer for silicidation in the present embodiment. The metal of the refractory metal layer 16 and the Si of the second conductive layer 15 are thermally treated, and a silicide layer 17 is thereby formed, as seen in FIG. 1D.

When titanium is used in the refractory metal layer 16 and when an $SiO_2$ buffer layer is formed between the Ti layer and Si layer and the first conductive layer 13 at the time of the formation of the silicide layer of $TiSi_2$, a $TiSi_2$ silicide layer is formed by chemically reducing the $SiO_2$ layer.

It is a characteristic of the present invention that the silicidation process is possible when the thickness of the $SiO_2$ buffer layer 14 is about 80 angstroms, and relatively inhibited when its thickness is substantially beyond 80 angstroms.

Thus, the thickness of the buffer layer 14 is preferably in the range of about 10 to 100 angstroms, as mentioned above. $O_2$ from the reduction of the $SiO_2$ layer is contained in the $TiSi_2$ layer.

When a metal other than titanium is used in the refractory metal layer 16, metals like Zr, Hf, V, Nb, Ta, etc. have high $O_2$ solubility to reduce the $SiO_2$ layer, and are preferably selected instead of titanium. In contrast, Cr, Mo, W, etc. have low $O_2$ solubility.

When the buffer layer 14 is formed of TiN instead of $SiO_2$, the TiN layer 14 becomes a barrier metal layer, and serves as an electric conductor. TiN is a stable material and can prevent diffusion of Si and is therefore also suitably used as a buffer layer according to the present invention. In this situation, the TiN layer (i.e., the buffer layer 14) can exist during the silicidation process but since there is effectively no functional difference between TiN and $TiSi_2$, in this context it can be said that the buffer layer 14 becomes incorporated into the silicide layer 17 and is therefore not separately indicated in FIG. 1D.

Thus, the buffer layer 14 is interposed between the first conductive layer 13 and the second conductive layer 15 (which does not have an impurity) during the silicidation process, and prevents Si from the first conductive layer 13 from moving to the second conductive layer 15 to prevent agglomeration.

Conventionally, a polycrystalline silicon layer is used as a source of Si to form a silicide layer, but the thickness of the silicide layer typically becomes uneven. In the present invention, however, a silicidation process can be performed just through having the second conductive layer 15, and is not adversely affected by the high density first conductive layer 13, as noted above. The present invention has an advantage of obtaining a silicide layer having a substantially even thickness.

Figure 2A:
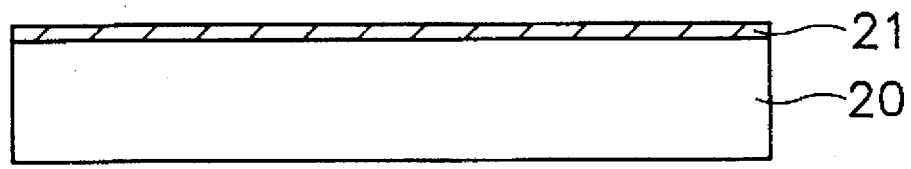
FIGS. 2A to 2C depict the steps in the formation of a silicide film in accordance with a second embodiment of the present invention.

A second embodiment of this invention is similar to the first preferred embodiment. The steps as shown in FIGS. 2A and 2B are the same as those appearing in FIGS. 1A and 1B, respectively, so a detailed description of FIGS. 2A and 2B is therefore not repeated here.

Figure 2B:
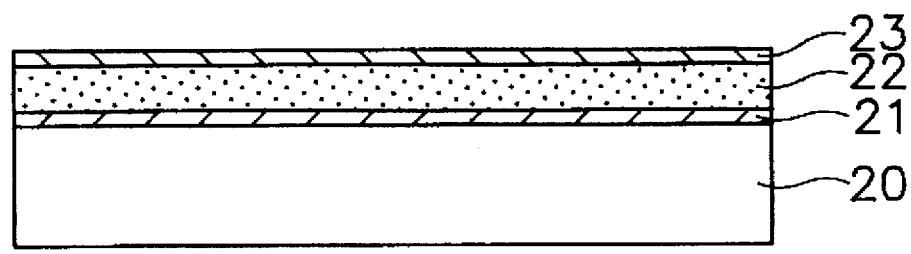

After an insulating layer 21 (an "underneath layer") is formed on a semiconductor substrate 20, a first conductive layer 22 and a buffer layer 23 are formed on the underneath layer 21 in FIG. 2B, like in FIG. 1B. At this time, it is preferable to carry out an impurity ion implantation or phosphorus-oxychloride deposition to lower the sheet resistance of the first conductive layer 22, similar to the first preferred embodiment.

Figure 2C:
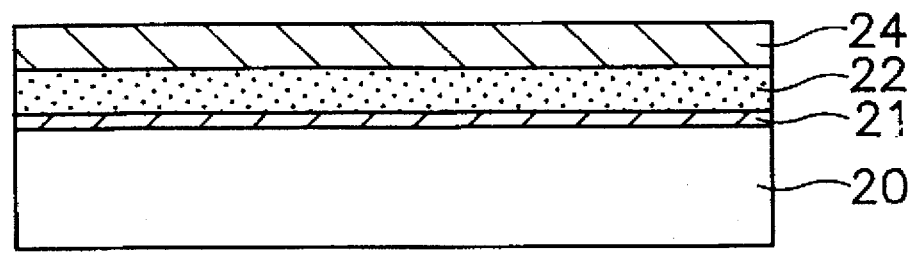
Figure 3A:
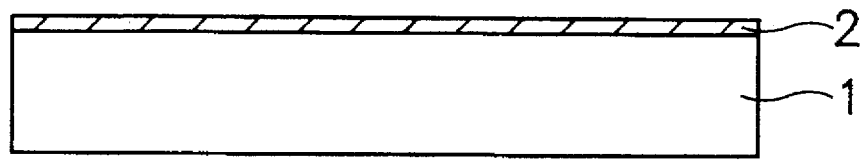
FIGS. 3A to 3D depict the steps in the formation of a silicide film in a conventional method way.
Figure 3B:
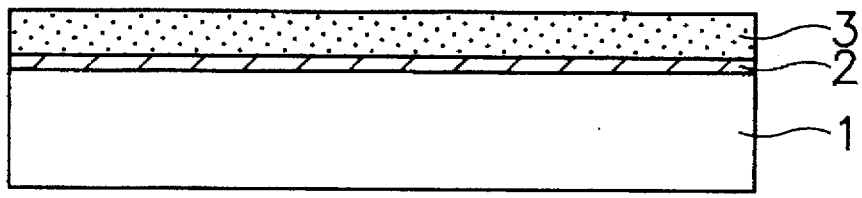
Figure 3C:
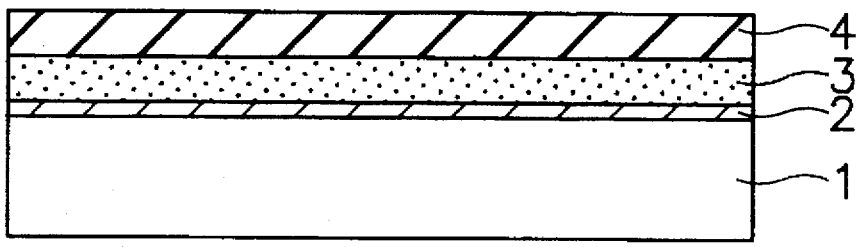
Figure 3D:
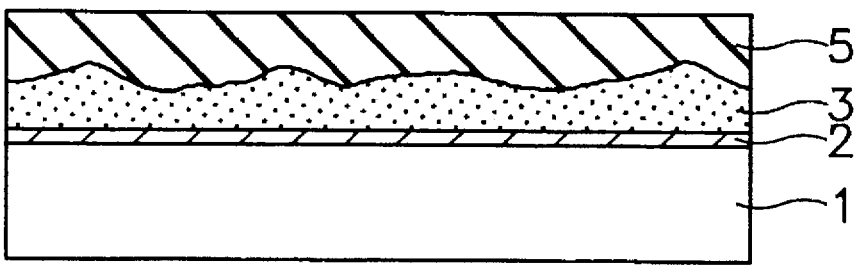

Subsequently, a second conductive layer 24 is formed by co-sputtering metal and silicon that are silicided over the first conductive layer 22, as shown in FIG. 2C, or by direct-sputtering from the silicide target. The second conductive layer 24 is then changed to a stable silicide layer 24 by a heating treatment.

The silicide layer 24 made according to the present invention as described above can reduce sheet resistance. For example, an average sheet resistance of a conventional silicidation by a single polycrystalline silicon layer is 5.952 $\Omega/\square$, and 1.672 $\Omega/\square$ according to the standard deviation. In the case where the polycrystalline silicon layer of three-layer structure of the present invention is used, the sheet resistance of the silicide layer is 3.536 $\Omega/\square$ on an average, and its standard deviation is 0.160 $\Omega/\square$. In addition, a silicide layer of even thickness may be obtained without agglomeration.

While the present invention has been described in connection with what is considered to be the preferred embodiments, it is to be understood that the present invention is not limited to the disclosed embodiments, but, on the contrary, is intended to cover various modification and equivalent arrangements included within the spirit and scope of the appended claims.

What is claimed is:

1. A pre-silicidation semiconductor device portion which is heat-treatable to obtain a silicide layer having smooth upper and lower surfaces comprising:

a semiconductor substrate;

an insulating layer formed on said semiconductor substrate;

a polysilicon layer formed on said insulating layer;

a diffusion barrier layer formed on said polysilicon layer;

an upper silicon layer formed on said diffusion barrier layer, wherein said diffusion barrier layer comprises a means for preventing particles in said polysilicon layer from diffusing into said silicon layer during silicidation; and a refractory metal layer formed on said upper silicon layer.

2. A pre-silicidation semiconductor device portion as set forth in claim 1, wherein said diffusion barrier layer is formed of an oxide layer or a TiN layer.

3. A pre-silicidation semiconductor device portion as set forth in claim 1, wherein said diffusion barrier layer is an impurity-doped part of said first conductive layer.

4. A pre-silicidation semiconductor device portion as set forth in claim 3, wherein said impurity-doped part of said first conductive layer is doped with nitride ions or nitride molecules.

5. A pre-silicidation semiconductor device portion as set forth in claim 1, wherein said second conductive layer is formed of a material selected from the group consisting of an undoped amorphous silicon and an undoped polycrystalline silicon.

6. A pre-silicidation semiconductor device portion as set forth in claim 1, wherein said refractory metal is formed of a material selected from the group consisting of Zr, Hf, V, Nb, and Ta.

7. A pre-silicidation semiconductor device portion as set forth in claim 1, wherein said first conductive layer is made from a doped polycrystalline silicon.

8. A pre-silicidation semiconductor device portion as set forth in claim 7, wherein said second conductive layer is made from an undoped amorphous silicon.

9. A pre-silicidation semiconductor device portion as set forth in claim 7, wherein said second conductive layer is made from an undoped polycrystalline silicon.

10. A pre-silicidation semiconductor device portion which is heat-treatable to obtain a silicide layer having smooth upper and lower surfaces comprising:

a semiconductor substrate;

an insulating layer formed on said semiconductor substrate;

a polysilicon layer formed on said insulating layer;

a diffusion barrier layer formed on said polysilicon layer;

an upper silicon layer formed on said diffusion barrier layer, wherein said diffusion barrier layer possesses structure which prevents particles in said polysilicon layer from diffusing into said silicon layer during silicidation; and a refractory metal layer formed on said upper silicon layer.

11. A pre-silicidation semiconductor device portion as set forth in claim 10, wherein said diffusion barrier layer is formed of an oxide layer or a TiN layer.

12. A pre-silicidation semiconductor device portion as set forth in claim 10, wherein said diffusion barrier layer is an impurity-doped part of said first conductive layer.

13. A pre-silicidation semiconductor device portion as set forth in claim 12, wherein said impurity-doped part of said first conductive layer is doped with nitride ions or nitride molecules.

14. A pre-silicidation semiconductor device portion as set forth in claim 10, wherein said second conductive layer is formed of a material selected from the group consisting of an undoped amorphous silicon and an undoped polycrystalline silicon.

15. A pre-silicidation semiconductor device portion as set forth in claim 10, wherein said refractory metal is formed of a material selected from the group consisting of Zr, Hf, V, Nb, and Ta.

16. A pre-silicidation semiconductor device portion as set forth in claim 10, wherein said first conductive layer is made from a doped polycrystalline silicon.

17. A pre-silicidation semiconductor device portion as set forth in claim 16, wherein said second conductive layer is made from an undoped amorphous silicon.

18. A pre-silicidation semiconductor device portion as set forth in claim 16, wherein said second conductive layer is made from an undoped polycrystalline silicon.

* * * * *